United States Patent [19]

Nozuyama

[11] Patent Number: 5,588,006
[45] Date of Patent: Dec. 24, 1996

[54] LOGIC CIRCUIT HAVING A CONTROL SIGNAL SWITCHING LOGIC FUNCTION AND HAVING A TESTING ARRANGEMENT

[75] Inventor: Yasuyuki Nozuyama, Tokyo, Japan

[73] Assignee: Kabushiki Kaisha Toshiba, Kanagawa-ken, Japan

[21] Appl. No.: 139,011

[22] Filed: Oct. 21, 1993

[30] Foreign Application Priority Data

Oct. 22, 1992 [JP] Japan ................................. 4-284101

[51] Int. Cl.⁶ ................................................ G06F 11/00
[52] U.S. Cl. ................................................. 371/3
[58] Field of Search .......................... 371/3, 22.1, 22.3, 371/22.4, 22.5, 22.6

[56] References Cited

U.S. PATENT DOCUMENTS

| | | | |
|---|---|---|---|
| 4,377,757 | 3/1983 | Koenemann et al. | 307/303 |
| 4,598,401 | 7/1986 | Whelan | 371/25 |
| 4,601,033 | 7/1986 | Whelan | 371/25 |
| 4,779,273 | 10/1988 | Beucler et al. | 371/25 |
| 4,965,511 | 10/1990 | Nishimura et al. | 324/73.1 |
| 5,042,034 | 8/1991 | Correale, Jr. et al. | 371/22.3 |
| 5,043,990 | 8/1991 | Doi et al. | 371/68.1 |
| 5,184,067 | 2/1993 | Nozuyama | 324/158 R |
| 5,189,675 | 2/1993 | Nozuyama et al. | 371/22.3 |

FOREIGN PATENT DOCUMENTS 1595597  8/1981  United Kingdom ......... H03K 17/687

*Primary Examiner*—Robert W. Beausoliel, Jr.
*Assistant Examiner*—Stephen C. Elmore
*Attorney, Agent, or Firm*—Finnegan, Henderson, Farabow, Garrett & Dunner, L.L.P.

[57] ABSTRACT

A logic circuit for a built-in self test or for a built-in logic block observer responds to at least first and second input signals and control signals. The circuit includes a first circuit with two outputs, one for always outputting the second input signal, and the other for outputting the second input signal and the inverse value thereof according to a first control signal, a second circuit for selecting and outputting one of the two outputs of the first circuit according to the first input signal, then outputting an exclusive OR value or an exclusive NOR value of the first input signal and the second input signal, and a third circuit for providing a third input signal or a fixed value as a second input signal to the first circuit according to a second control signal. The inversion functions for obtaining an adequate polarity of signals employing clocked inverters, or transfer gates and an inverter. The logic functions also employ cascaded flip-flop circuits and a linear feedback shift register.

10 Claims, 7 Drawing Sheets

| A B | OPERATION |
|---|---|
| 0 0 | all-0 INPUT |
| 0 1 | SCANNING OPERATION |
| 1 0 | NORMAL OPERATION |
| 1 1 | SIGNATURE COMPRESSION |

| A B | OPERATION |
|---|---|
| 0  0 | all-0 INPUT |
| 0  1 | SCANNING OPERATION |
| 1  0 | NORMAL OPERATION |
| 1  1 | SIGNATURE COMPRESSION |

LOGIC CIRCUIT HAVING A CONTROL SIGNAL SWITCHING LOGIC FUNCTION AND HAVING A TESTING ARRANGEMENT

TECHNICAL FIELD

The present invention relates to a logic circuit having a control signal switching logic function and having a testing arrangement and, in particular, to such a logic circuit on a single semiconductive chip.

BACKGROUND ART

As a result of rapid advances in semiconductor technology, Very Large Scale Integrated Circuits (VLSIs) which are much larger in scale and more complicated than Large Scale Integrated Circuits (LSIs), and which exhibit superior performance, have already made their appearance, and Ultra Large Scale Integrated Circuits (ULSIs) are soon expected. As a result, serious problems arise with regard to the type of tests that will be required for the chips.

With conventional LSI chips, testing is normally performed with an LSI tester, using only the functions which are defined for use in normal operations, but with VLSIs and ULSIs it has become necessary to provide an expanded volume of test vectors. Also, LSI testers which can cope with tests for these chips require higher and higher performance and therefore cost more.

In addition, it is necessary to consider performing still further tests to test the chip to an adequate degree. For this reason, considerable cost must be incurred for a Central Processing Unit (CPU). The complete testing of VLSI and ULSI chips by conventional means is therefore almost impossible in practice. In order to solve such a serious problem, a test circuit is incorporated in the chip in advance for easy testing, and much attention is being paid to testability and cost. A built-in self test (hereinafter BIST), uses one type of design for testability comprising a test signal generating circuit for a circuit device under test (hereinafter we call it "DUT"). A test result evaluation circuit is built into the LSI chip. The test is initiated by an external signal. After the test is completed, signals indicating that the DUT is judged to be good or not good, or data indicating the test result are output. Because an LSI tester is usually not required, test costs are very effectively reduced. Furthermore, the test can be performed under the same conditions in which the chip is used in practice so that testing is possible after the chip has been installed. Because of these many conspicuous advantages, it is expected that the BIST will play an extremely important role in testing VLSIs and ULSIs.

In the above-mentioned type of BIST, the most basic technology is known as signature analysis. This technology is based on a linear feedback shift register (hereinafter LFSR), which will now be explained. An LFSR (n bits in width) can be used as both a test signal generating circuit and a test result evaluation circuit. An LFSR as a test signal generating circuit, as illustrated in FIG. 1A (where n=8), is a simple register circuit comprising n D-type flip-flops 31 connected in series and a feedback circuit 32 for creating an exclusive OR (hereinafter XOR) of outputs Q of specific flip-flops 31 and inputting the XOR output to the D-input of the first of the serially-connected flip-flops 31.

When activated by the setting of an initial value other than all-0s in the flip-flops 31-0 to 31-7 (the circuit for initializing the LFSR has been omitted from the drawings), $(2^n-1)$ items of pseudo-random data are output, repeated in a set order. Serial output is possible if any of the pseudo-random data outputs from the n flip-flops 31 is utilized, and, in addition, parallel output is possible if some or all of these outputs are utilized. With recent VLSIs or ULSIs for data processing of many bit widths, the latter method is normal and important.

Signature analysis is the technology using an LFSR as a test result evaluation circuit. In this case, a serial-input type LFSR to which the output from a DUT is input serially, and a parallel-input type LFSR, referred to as a multiple input signature register (MISR), are also used.

However, with a VLSI or ULSI the latter method is, of course, exceedingly important. Accordingly, this explanation will be restricted to this type of LFSR.

An example of the configuration of an n-bit parallel input type of LFSR is shown in FIG. 1B (for n=8). The Q output of a bit i (i=0, ..., 6) of the flip-flops 33 in the LFSR and external data (Ini+1) of the bit i+1 are input to a D input of a bit (i+1) of the flip-flop 33 through an attached XOR circuit 34. In addition, the output of the feedback circuit 32 of the previously described LFSR and the external data of the bit 0 are input through the XOR circuit 34 to the D input of a bit 0 of the flip-flop 33.

With this configuration, when the response output from the DUT are sequentially applied to the LFSR in which at first a certain known value is stored, pseudo-random data are formed in the internal flip-flops of the LFSR corresponding to these values, and finally, certain inherent test result data are formed in the LFSR. The data created in the LFSR are referred to as a signature, and the operation by which the response output from the DUT is applied and the signature created is referred to as a signature compression.

Signature analysis is an analytical method wherein the response output from the DUT is signature-compressed for a sequence of test data; and, finally, the DUT is evaluated as good or not good by comparing the test results (signature) remaining in the LFSR with the expected value only once.

In general, after signature compression is executed with a sufficient number of test data, the reliability, that a signature indicating the DUT to be fault-free is really true, is calculated by subtracting an "aliasing" probability which is equal to that of a faulty DUT outputting the same signature as that of a fault-free DUT from 1, and the "Aliasing" probability is $2^{-n}$ which can normally be ignored if n is large (n>24). Therefore, with a VLSI or ULSI which normally processes data of many bits in width (n≧32), the reliability of signature analysis is extremely high. Furthermore, although the above-mentioned LFSR is provided exclusively with a BIST, it is also often used as a register for normal operation, resulting in an economy in test circuitry. However, there are also problems associated with this type of BIST. The most important of these is the reverse of the merits of the BIST. After execution of the BIST, because basically only one piece of test result data remains in which the response data from the DUT is signature compressed for much test data, it is possible only to detect the occurrence of erroneous or wrong outputs during the BIST. Because it is not possible to know the cycle or time of the output data when erroneous outputs occur, it is not easy to diagnose an erroneous output to specify the location of the corresponding fault in the DUT. As the simplest and most effective method of solving this problem, a feedback loop for an exclusive OR of the LFSR is isolated in a suitable test mode and included in the data route (referred to as the scan chain) in which the serial-connected section of the flip-flops which comprise the LFSR is connected to an external part of the chip so that the contents can be read out serially (referred to as scan transmission).

Furthermore, when data is set to a certain data in the LFSR, the BIST can be initialized. (This initialization can also be performed in series by means of a scan operation). In this manner, four types of operations, specifically, normal operation, signature compression, scanning operations, and fixed data setting operation, are possible in a register circuit used as a BIST. This is extremely important in providing a BIST for overcoming the weak points in fault diagnosis. A representative example of a register for a BIST with the technology outlined above is a BILBO (built-in logic block observer).

This BILBO is illustrated in FIG. 2 (8-bit width). The operation of this circuit is determined by two mode signals B1 and 2. When B1=1 and B2=1, normal operation is carried out (each output Z1 to Z8 from the DUT is stored in separate D-type flip-flops 41) (FIG. 3A); and when B1=1 and B2=0, each flip-flop 41 operates as a parallel input LFSR (FIG. 3C), and parallel signature compression is possible. In addition, when B1=0 and B2=0, each flip-flop 41 becomes a shift register which can perform a scan operation (FIG. 3B). Further, although not shown in the drawings, when B1=0 and B2=1, fixed data setting (reset) is possible.

In the BILBO method outlined above, a BIST register containing a BIST with a simple structure which overcomes the weak points in the above-mentioned fault diagnosis is provided. However, in the BILBO method, in order to provide a scan operation (and fixed data setting), it is necessary to insert an AND circuit 43 between the output of the DUT and the flip-flop inside the LFSR, in addition to an indispensable exclusive OR circuit 42 for signature compression, and there is a major drawback in that the performance is degraded during normal operation. The countermeasures for the drawbacks of this BILBO method, restricted to the case where the DUT has a ratio type or a precharged type output, are comparatively simple.

Specifically, as illustrated in a ratio-type ROM 51 as shown in FIG. 4, there is a connection between each output and the ground potential, and the elements are turned ON and OFF by means of a common signal. A scan operation and the setting of initial values can be provided by turning the elements ON without the insertion of an AND circuit.

In FIG. 4, the reference numeral 53 designates a word line, the reference numeral 54 a bit line, and the reference numeral 52 a load circuit for the bit line, comprising a PMOS element which is normally ON. The data in a ROM 51 is determined by whether an NMOS element 55 is positioned (logic 0) or not (logic 1) at the point where the bit line 54 and the word line 53 intersect. In addition, the reference letter A designates the above-mentioned common signal, and the reference numeral 56 designates an NMOS element which is turned ON or OFF by the signal A.

As can be clearly understood from FIG. 4, when the common signal A is set at "1", the output of the bit line 54 is mandatorily set to logic "0". Therefore, a scan operation (when B=1) or fixed data setting (when B=0) is provided according to the value of the signal B (A=0 and B=0 gives normal operation; A=0 and B=1 gives parallel signature compression), and the AND circuit becomes unnecessary as far as the BILBO is concerned.

However, for the above-mentioned type of countermeasure to be possible, the output of the DUT must, strictly speaking, be the ratio type or the precharged type. A solution is not obtained in the case of a more common output.

On the other hand, there is a conventional semiconductor circuit device in which a built-in test circuit with improved operational speed is disclosed for the conventional semiconductor integrated circuit device for which a selector circuit S1 to S5 is provided for which the output Q1 to Q5 of an external input line I1 to I5 and a D-type flip-flop circuit F1 to F5 becomes the input.

A fed-through mode passed through a register section is operated by outputting the external input via the selector circuit.

However, even with this type of test circuit, an AND circuit which is required for the scan operation is utilized in the same manner as the BILBO method shown in FIG. 2, together with the exclusive OR circuit required in signature compression.

As outlined above, in a conventional BILBO it is necessary to insert an AND circuit into the data route from the output of a DUT to a data input terminal D for a flip-flop comprising an LFSR, in addition to an indispensable XOR circuit for signature compression, for a scan operation.

Accordingly, operating speed during normal operation drops; and performance drops because data obtained from the DUT is set in the flip-flop through the XOR circuit and the AND circuit.

SUMMARY OF THE INVENTION

Accordingly, an object of the present invention is, with due consideration to the drawbacks described above, to provide a logic circuit providing the same function as a BILBO and to provide a testable circuit using this logic circuit without incorporating an AND circuit in the data path between flip-flops composing an LFSR and a circuit to be tested.

In order to solve the conventional problem described above, the invention provides a logic circuit wherein a first input signal and a second input signal are received together with a first control signal, and wherein, in the case where the first control signal has one logical value, an exclusive OR value or an exclusive NOR value of the first input signal and the second input signal is output, and, in the case where the first control signal has another logical value, the value or the inverse value of the second input signal is output, regardless of the logical value of the first input signal.

The present invention provides a logic circuit as another preferred embodiment, wherein in a first circuit with two output terminals of the logic circuit a second input signal and a first control signal are received, and, in the case where the first control signal has one logical value, a second input signal and the inverse value of the second input signal are output from each of the output terminals. In the case where the first control signal has another logical value, the second input signal is output from both of the output terminals. In a second circuit of the logic circuit a first input signal and the two output signals from the first circuit are received, and, in the case where the first control signal has one logical value, an exclusive OR value of the first input signal and the second input signal is output by selecting and outputting a second input signal or its inverse value which is output from the first circuit in accordance with the logical value of the first input signal. In the case where the first control signal has another logical value, the second input signal which is output from both of the output terminals of the first circuit is also output from the second circuit regardless of the logical value of the first input signal.

Another preferred embodiment provides a first circuit with two output terminals wherein a second input signal and a first control signal are received, and, in the case where the first control signal has one logical value, the second input signal and the inverse value of the second input signal are output from each of the output terminals. In the case where the first control signal has another logical value, the second input signal is output from both of the output terminals. This embodiment provides a second circuit wherein the first input signal and an output signal from the first circuit are received. In the case where the first control signal has the one logical value, an exclusive NOR value of the first input signal and the second input signal is output by selecting the second input signal or its inverse value that is output from the first circuit in accordance with the logical value of the first input signal, then inverting and outputting the selected signal. In the case where the first control signal has the other logical value, the second input signal that is output from both of the output terminals of the first circuit is inverted and output from the second circuit regardless of the logical value of the first input signal.

Another preferred embodiment of the invention provides, in addition to the first and second circuits just described, a third circuit with one output wherein a third input signal and a second control signal are received. In the case where the second control signal has one logical value, the third input signal is output to the first circuit as the second input signal. In the case where the second control signal has the other logical value, a fixed value is output to the first circuit as the second input signal.

In another preferred embodiment having the first and second circuits last described above, a third circuit receives a third input signal and a second control signal. In the case where the second control signal has the first logical value, the inverted value of the third input signal is output to the first circuit as the second input signal. In the case where the second control signal has the other logical value, a fixed value is output to the first circuit as the second input signal.

In another preferred embodiment of a logic circuit according to the invention, there is additionally provided in the first circuit a first inverter for inverting the first control signal and outputting the inverted signal; a first clocked inverter receiving the second input signal for inverting and outputting that signal, or, disabling that signal (turning itself OFF) in accordance with the first control signal and the output signal from the first inverter. There is further provided a first transfer gate for disconnecting I/O terminals of the first clocked inverter when the first clocked inverter is ON and connecting the I/O terminals of the first clocked inverter when the first clocked inverter is OFF, in accordance with the first control signal and the output signal from the first inverter. The second circuit includes in addition a second inverter for inverting the first input signal and outputting the inverted signal; a second transfer gate for controlling the connecting and disconnecting of the output terminal of the first clocked inverter and the output terminal of the second circuit in accordance with the first input signal and the output signal from the second inverter; and a third transfer gate for controlling the disconnecting and connecting of the input terminal of the first clocked inverter and the output terminal of the second circuit inversely to the connecting and disconnecting of the second transfer gate, in accordance with the first input signal and the output signal from the second inverter.

In another embodiment of the invention, the first circuit includes a first inverter for inverting the first control signal and outputting the inverted signal; a first clocked inverter receiving the second input signal for inverting and outputting that signal, or, disabling that signal in accordance with a first control signal and an output signal from the first inverter; and a first transfer gate for disconnecting I/O terminals of the first clocked inverter when the first clocked inverter is ON, and connecting the I/O terminals of the first clocked inverter when the first clocked inverter is OFF, in accordance with the first control signal and the output signal from the first inverter. In this embodiment, the second circuit comprises a second inverter for inverting the first input signal and outputting the inverted signal, a second clocked inverter for which the input terminal is connected to the output terminal of the first clocked inverter for ON/OFF control according to the first input signal and the output signal of the second inverter; and a third clocked inverter for which the input terminal is connected to the input terminal of the first clocked inverter and the output terminal is connected to the output terminal of the second clocked inverter for ON/OFF control inversely to the ON/OFF control of the second clocked inverter, according to the first input signal and the output signal of the second inverter.

Another preferred embodiment provides as a testable circuit in addition to a logic circuit as described above, n flip-flop (F/F) circuits connected in cascade via a logic circuit so that a third input signal of the logic circuit becomes the output of the preceding F/F circuit and the output signal of the second circuit of the logic circuit becomes the input for the subsequent F/F circuit; a feedback circuit comprising an exclusive OR circuit which performs an exclusive OR on the output of specified F/F circuits including the nth F/F circuit; and a selection circuit connected to the first stage F/F circuit through a logic circuit which selects an output signal from a scan chain or an output signal from the feedback circuit and makes the selected signal the third input signal, based on the first control signal.

The present invention further provides, as an addition to the testable circuit just described, an arrangement of the logic circuit described above, wherein, in accordance with a first control signal and a second control signal, the output from a device under test is input in parallel as a first input signal and signature-compressed in the case where the first and second control signals have one logical value. The output from the device under test is stored in a respective corresponding F/F circuit to the first input signal in the case where the first control signal has one logical value and the second control signal has another logical value. The content stored in the F/F circuit is scanned and consecutively read out in the case where the first control signal has the other logical value and the second control signal has the one logical value; and a fixed value is stored in the F/F circuit in the case where the first and second control signals have the other logical value.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1A:
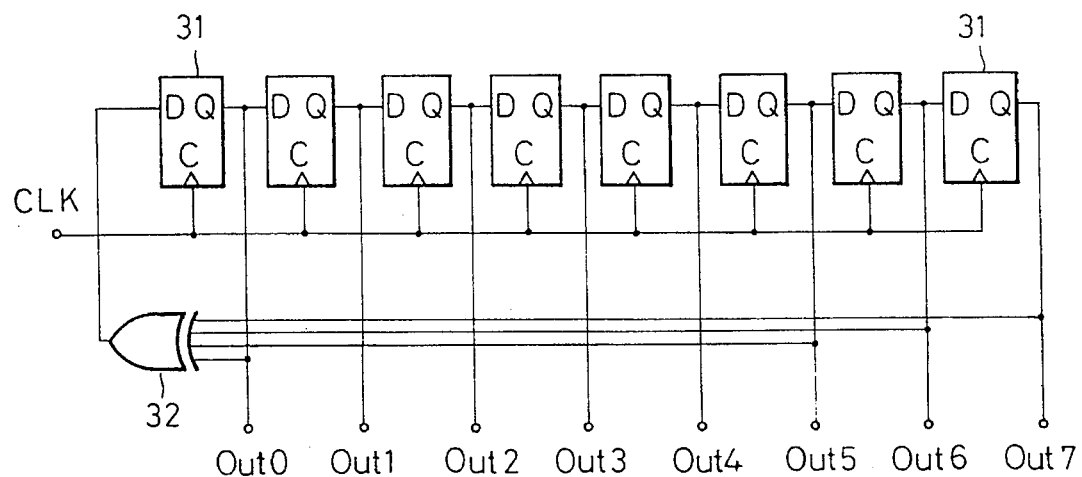
FIGS. 1A and 1B are diagrams showing the configuration of a conventional linear feedback shift register.
Figure 1B:
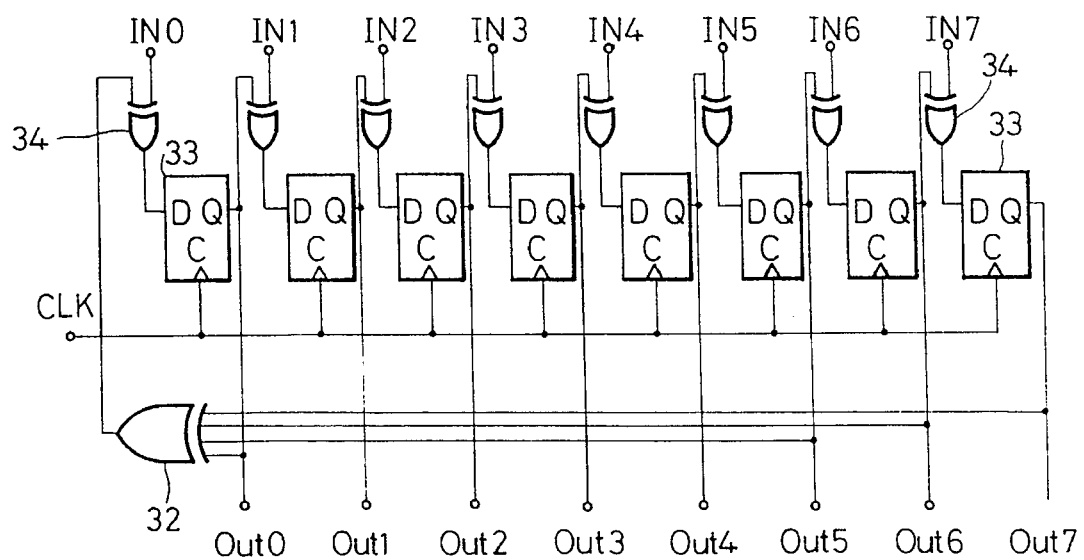

Embodiments of the present invention will be described with reference to drawings.

Before describing the preferred embodiments of the present invention in detail we will briefly explain the basic concept of the present invention.

In a logic circuit of the present invention, one signal or the inverse value thereof is output after occurrence of an exclusive OR value of two input signals according to a first control signal.

In a logic circuit of the present invention, an exclusive OR (XOR) value of a first input signal and a second input signal is obtained by outputting a second input signal and the inverse value of the second input signal according to a first control signal, and by selecting and outputting the second input signal or, its inverse value in accordance with the first input signal.

In a logic circuit of the present invention, an XOR value of a first input signal and a second input signal is obtained by inverting the signal selected after the second input signal and the inverse value of the second input signal are output according to a first control signal, and by selecting and outputting the second input signal or, its inverse value in accordance with the first input signal.

In a logic circuit of the present invention, an exclusive OR value of a first input signal and a third input signal is output when first and second control signals have one logical value, the first input signal is output when the first control signal has the one logical value and the second control signal has another logical value, the third input signal is output when the first control signal has the one logical value and the second control signal has another logical value, and a fixed value is output when the first and second control signals have another logical value.

In a logic circuit of the present invention, a first clocked inverter is ON, a first transfer gate is in a disconnected state, and either output from the first clocked inverter or the second input signal is selected and then output according to the first input signal when a first control signal has one logical value. Further, the first clocked inverter is OFF, the first transfer gate is in a connected state, and the second input signal is output regardless of the value of the first input signal when the first control signal has the another logical value.

In a logic circuit of the present invention, a first clocked inverter is ON, a first transfer gate is in a disconnected state, and either output of the first clocked inverter or the second input signal is selected and then output according to the first input signal when a first control signal has one logical value. Further, the first clocked inverter is OFF, the first transfer gate is in connected state, and the inverted value of the second input signal is output regardless of the value of the first input signal when a first control signal has the other logical value.

In a testable circuit of the present invention, according to first and second control signals, four types of operation modes are carried out. The four modes are a signature-compression, a normal operation for setting data from an object (device under test) circuit to be tested to a F/F circuit, a scanning operation, and a resetting operation for setting a fixed value to each F/F circuit.

We will now describe the preferred embodiments according to the present invention.

Figure 5A:
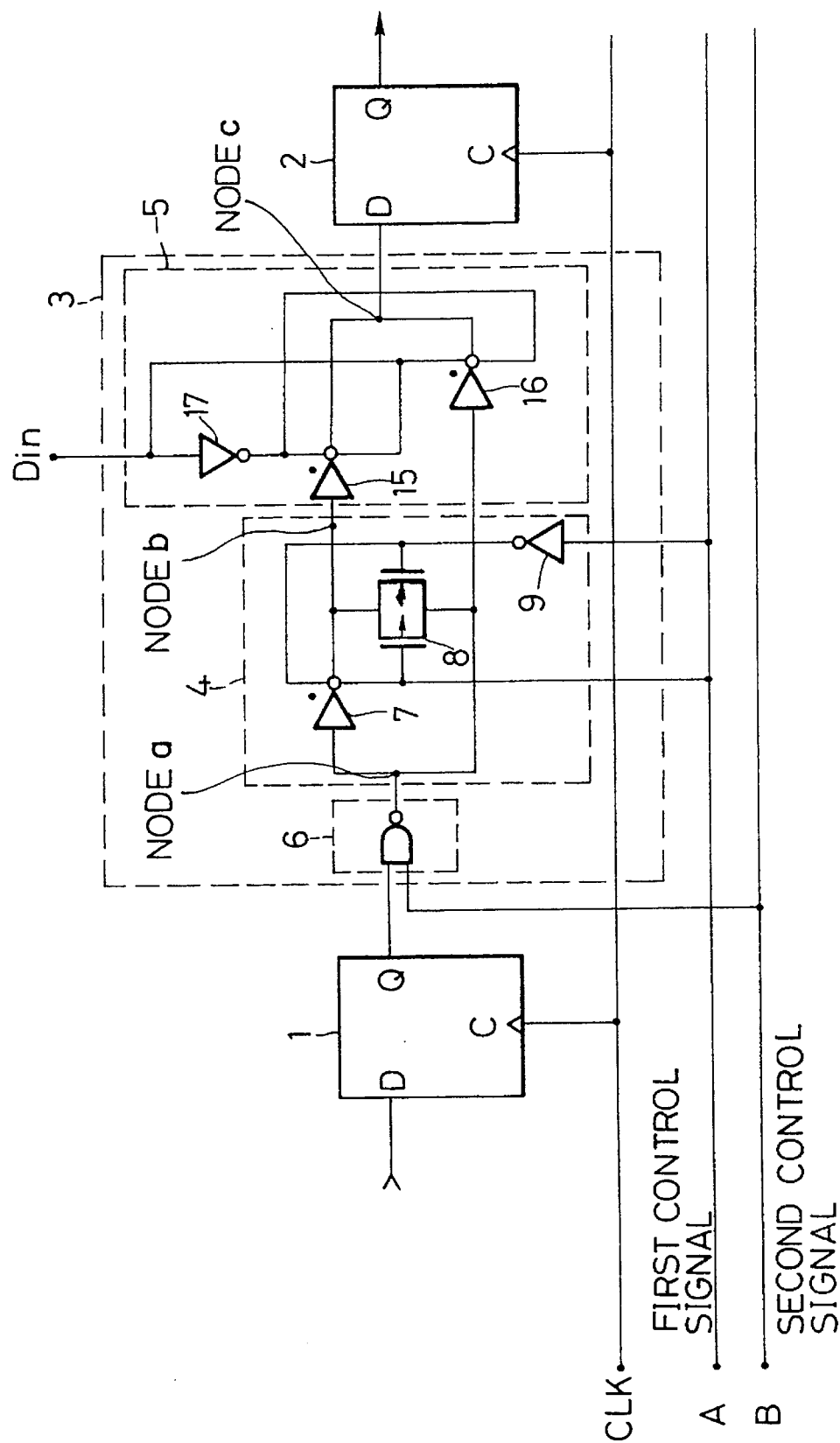
FIGS. 5A to 5C are diagrams showing the configuration and operation of part of a testable circuit using a logic circuit relating to a first embodiment of the present invention.
Figures 5B, 5C:
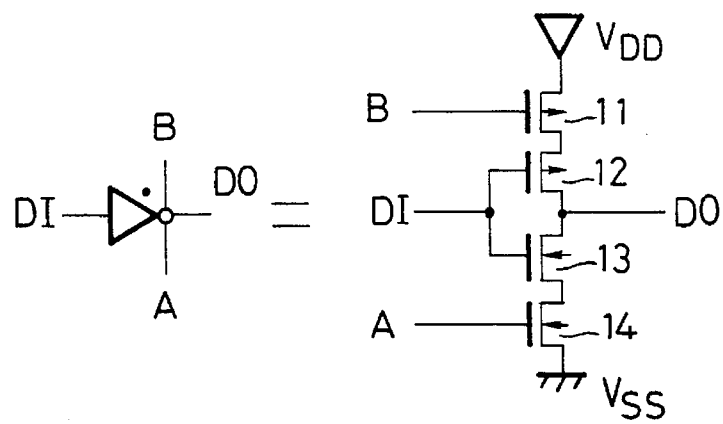

FIGS. 5A to 5C are diagrams showing part of a testable circuit relating to a logic circuit for a first embodiment of the present invention.

FIG. 5A is a configuration diagram. FIG. 5B is a configuration diagram of a clocked inverter shown in FIG. 5A. FIG. 5C is a table for explaining the operation of the circuits shown in FIG. 5A.

The testable circuit shown in FIG. 5A is a part of an LFSR (a register for a BIST) which is n bits wide. Illustrated is an ith –type flip-flop (F/F) circuit 1 (where i=1, 2, . . . , (n–1)) for an LFSR, an (i+1)th D-type flip-flop (F/F) circuit 2, and a logic circuit 3 connected to both the F/F circuits 1 and 2.

Figure 2:
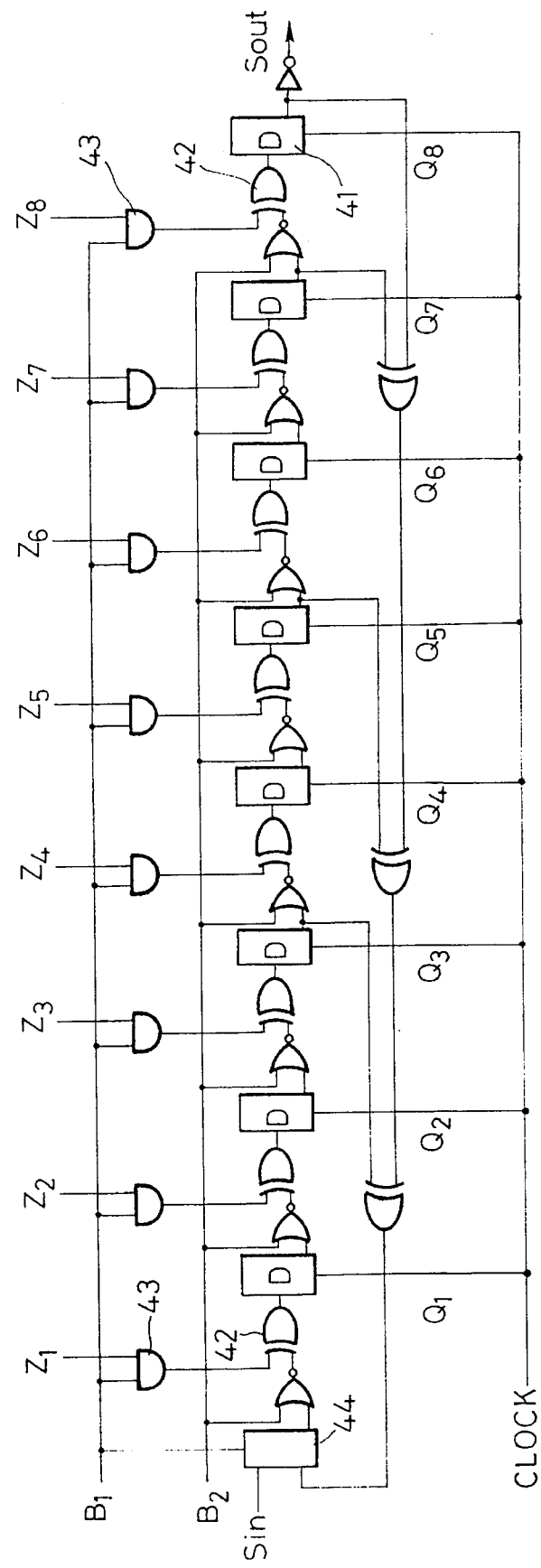
FIG. 2 is a diagram showing the configuration of a conventional built-in logic block observer (BILBO).

Also, in the testable circuit shown in FIG. 5A, an input D of the first F/F circuit is connected through the logic circuit 3 to the output of a multiplexer (omitted from the drawing) which is of the same type as a multiplexer 44 shown in FIG. 2.

This multiplexer functions as a selection circuit for selecting a scan chain output signal from a terminal which is connected from outside a chip during a scanning operation, or an output signal of a feedback circuit (omitted from the drawing) of an LFSR comprising an exclusive OR (XOR) circuit for performing an exclusive OR operation on the output of specified F/F circuits including an nth F/F circuit during a signature compression.

In FIG. 5A, the logic circuit 3, which is a special feature of the present invention, comprises a first circuit 4, a second circuit 5, and a third circuit 6.

The first circuit 4 comprises a clocked inverter 7, a transfer gate 8, comprising an N-channel FET and a P-channel FET, and an inverter 9. The clocked inverter 7, as shown in FIG. 5B, comprises a pair of P-channel FETS 11, 12, and a pair of N-channel FETS 13, 14. A signal B which controls the passage of electricity to the P-channel FET 11 and a signal A which controls the passage of electricity to the N-channel FET 14 have mutually reversed phases.

The clocked inverter 7 receives an input signal of the first circuit 4 provided to a node a, and is ON/OFF controlled by means of a first control signal A and the inverted signal of the first control signal A by an inverter 9. Specifically, the clocked inverter 7 functions as an inverter which is ON when the first control signal A is "1" (high level), and is OFF when the first control signal A is "0" (low level). The transfer gate 8 controls the connection and disconnection of I/O terminals of the clocked inverter 7 by means of the first control signal A and an inverted signal of the first control signal A by an inverter 9. Specifically, the transfer gate 8 disconnects the node a and the node b, that is, the I/O terminals of the clocked inverter 7 when the first control signal A is "1", and connects the node a and the node b of the clocked inverter 7 when the first control signal A is "0".

Accordingly, the first circuit 4 outputs without change the input signal provided to the node a when the first control signal A is "1," and outputs an inverted signal of the input signal inverted by the clocked inverter 7 from the node b. On the other hand, when the first control signal A is "0", the input signal is output without change from the node b through the transfer gate 8.

The second circuit 5 comprises a pair of clocked inverters 15, 16 and an inverter 17. The clocked inverter 15 receives an input signal from the node b which is a signal output from the first circuit 4, and provides ON/OFF control with an output signal (Din) from the Device under test (DUT) and an inverted signal of Din by the inverter 17, as a control signal. The clocked inverter 16 receives an input signal from the node a which is another signal output from the first circuit 4, and provides ON/OFF control with an output signal (Din) from the DUT and an inverted signal of Din by the inverter 17, as a control signal which is the reverse of the ON/OFF control for the clocked inverter 15.

Specifically, in the second circuit 5, when the output signal (Din) from the DUT is "1", the clocked inverter 15 is ON and the clocked inverter 16 is OFF and a signal which is the input signal provided to the node b is inverted and output to the node c. When the output signal (Din) from the DUT is "0" the clocked inverter 15 is OFF and the clocked inverter 16 is ON, and a signal which is the input signal provided to the node a is inverted and output to the node c.

Accordingly, the second circuit 5 has the function of a selector for selecting either one of the output signals which are output from the node a or the node b of the first circuit 4, receiving the output signal (Din) from the DUT as a selection control signal.

In the configuration wherein these types of the first circuit 4 and the second circuit 5 are cascadingly connected, the output signal (Din) from the DUT provided to the second circuit 5 becomes the first input signal. The input signal provided to the node a of the first circuit 4 becomes the second input signal. When the first control signal A is "1", and when the first and second input signals are both "1" or "0", the output signal of the node c is "1"; and when the first and second input signals are "1" "0" or "0" "1" the output signal of the node c is "0".

Accordingly, the first circuit 4 and the second circuit 5 have the function of an exclusive NOR (XNOR) circuit for conducting an exclusive NOR operation on the logical value provided to the node a and the logical value of the output signal (Din) from the DUT when the first control signal A is "1".

The third circuit 6 comprises a NAND circuit into which is input an output Q of the ith F/F circuit 1 and a second control signal B. The NAND output is provided to the node a and becomes the input to the first circuit 4.

In the logic circuit 3 in which this type of first circuit 4, second circuit 5, and third circuit 6 are cascadingly connected, when the first control signal A is "1" and the second control signal B is "1", the first circuit 4 and the second circuit 5 function as an XNOR circuit while the third circuit 6 functions as an inverter. Therefore, when the output signal (Din) from the DUT is the first input signal and the output Q of the ith F/F circuit 1 is the third input signal, then the logic circuit 3 functions as an XOR circuit into which the first input signal and the third input signal are input.

Figure 3A:
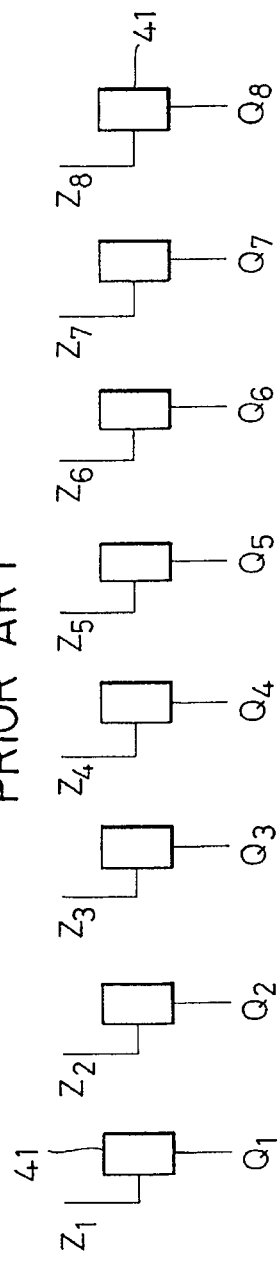
FIGS. 3A to 3C are diagrams showing the configuration of an equivalent circuit when operating the BILBO illustrated in FIG. 2.
Figure 3B:
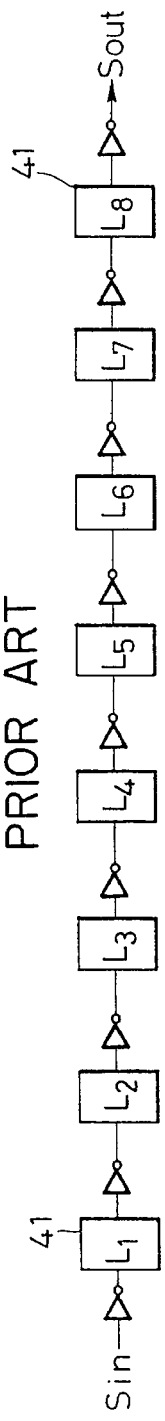
Figure 3C:
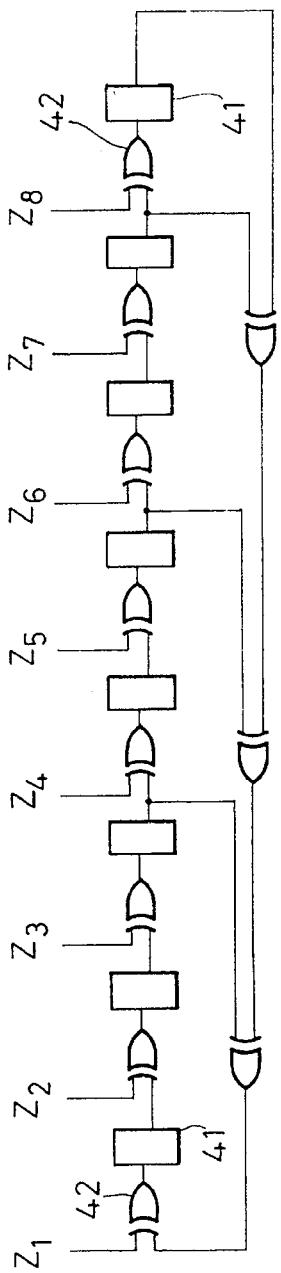
Figure 4:
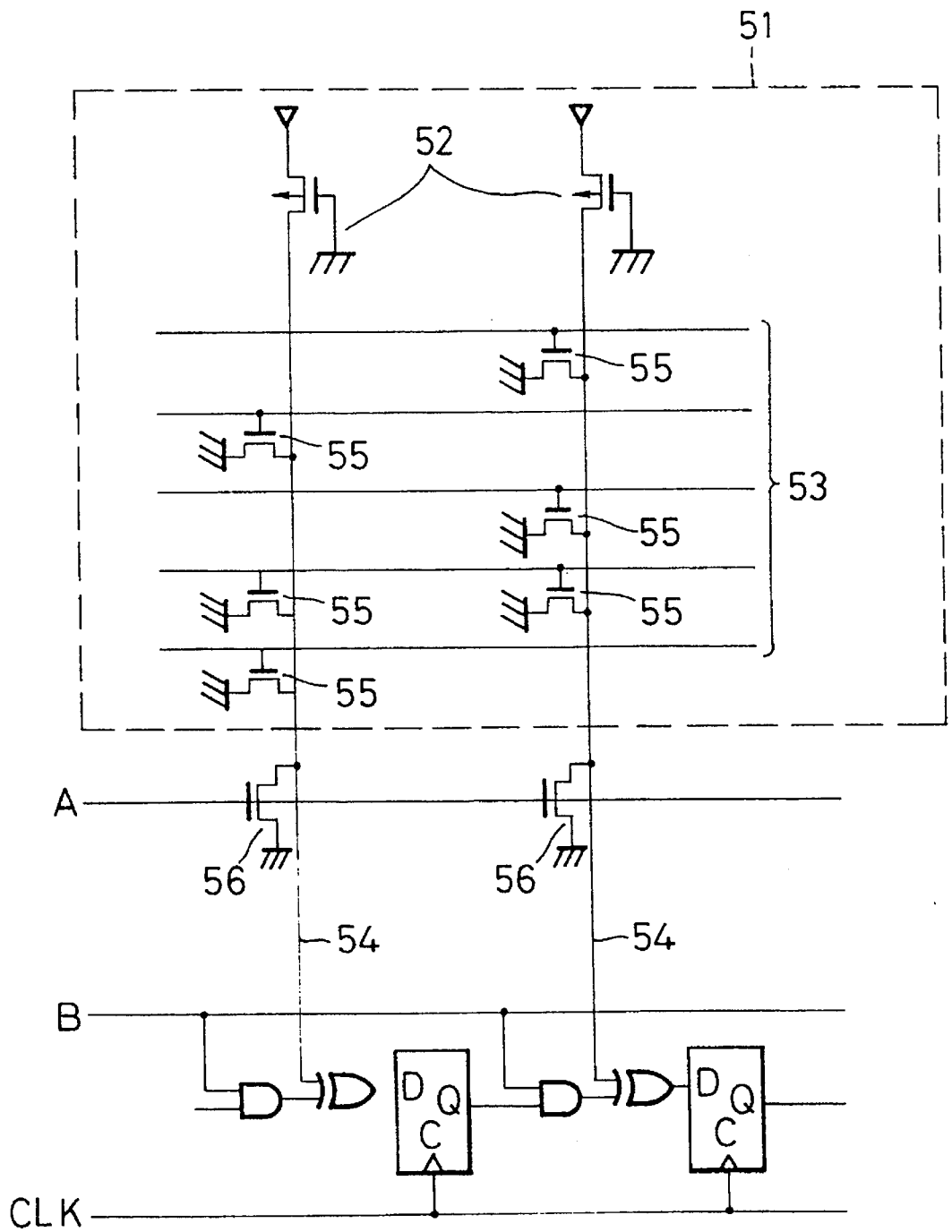
FIG. 4 is a diagram showing the configuration of a BILBO with a circuit having a ratio-type output to be tested.

Accordingly, as shown in FIG. 5C, when the first control signal A and the second control signal B are both "1", as shown in FIG. 3C, the output from the DUT is input as a parallel input and compressed to generate a signature in an LFSR illustrated in FIG. 5A.

Next, when the first control signal A is "1" and the second control signal B is "0", the first circuit 4 and the second circuit 5 function as an XNOR circuit. Because the output of the third circuit 6 is "1", a logical value which is the same as the output signal (Din) from the DUT of the first input signal is output from the logic circuit 3, and is provided to the (i+1)th F/F circuit 2. Accordingly, under this condition as shown in FIG. 5C, a normal operation is carried out in an LFSR, as shown in FIG. 5A. When the first control signal A is "0", the clocked inverter 7 of the first circuit 4 is OFF, and the transfer gate 8 is connected. Because both the node a and the node b of the first circuit 4 are the same as the output of the third circuit 6, the output of the logic circuit 3, becomes the inverted signal of the output of the third circuit 6, regardless of the output signal (Din) from the DUT. This is equivalent to an AND gate 43 being inserted in the data path of the output signal (Din) from the DUT and the F/F circuit 41 of the LFSR in the BILBO method shown in FIG. 2, so that the output from the AND gate 43 becomes "0" and the output signal from the DUT is made ineffective. Accordingly, as shown in FIG. 5C, when the first control signal A is "0" and the second control signal B is "1", as shown in FIG. 3B, the contents set in the respective F/F circuits are scanned, and a successive read out scan operation is carried out.

When the first and second control signals A and B are both "0", "0" is set in all the F/F circuits as a fixed value and a reset operation is performed.

As outlined above, with the testable circuit of the present invention, a normal operation, a signature compression, a scanning operation, and a fixed data setting (reset operation) are provided by means of a testable structure, in the same manner as the BILBO to which testability for fault diagnosis has been added.

At this time, as shown in FIG. 5A, the AND circuit 43 inserted between the DUT and the flip-flop 41 of the internal LFSR required with the BILBO as shown in FIG. 2 are unnecessary with the present invention, so that the performance drop during normal operation resulting from the BILBO can be lessened. It is expected that the built-in self test (BIST) will be released to future users many times.

In this case, the execution is at the same clock frequency as for normal operation. Here, it is important that the BIST can test the critical path at normal operation of the DUT, but recently, with the frequent appearance of VLSIs and ULSIs of the type that require high speed operation up to the utmost limit, there are many cases wherein operating speed becomes a bottleneck, and the degradation of normal operating performance by the addition of a BIST circuit means that a chip which is originally good performance is judged to be unacceptable by the BIST.

Accordingly, it is extremely important that the degradation of operating performance of these VLSIs and ULSIs as a result of the BIST (signature compression) be as slight as possible because this directly influences improvement in yield.

Accordingly, with the present invention, an improvement in yield can be expected in extremely high speed VLSIs and ULSIs in which the BIST tests the critical path during normal operation.

Figures 6A, 6B:
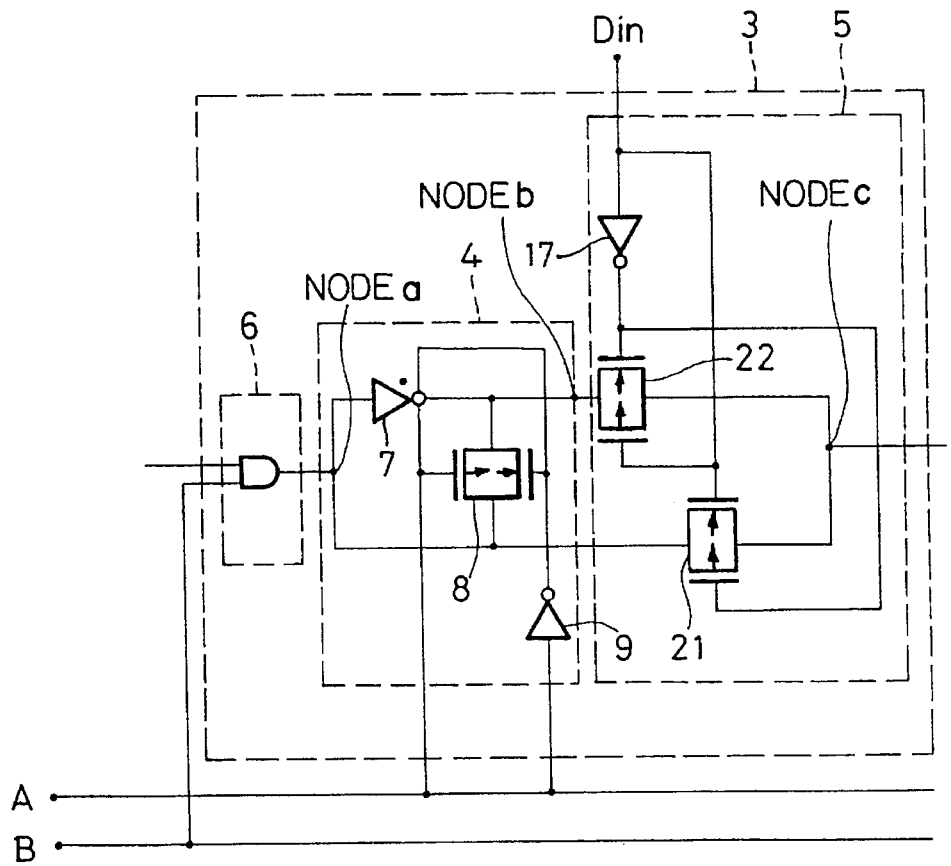
FIG. 6A and 6B are diagrams showing the configuration and operation of a logic circuit relating to a second embodiment of the present invention.

FIG. 6A is a diagram showing a second embodiment of the present invention. The special features of the embodiment illustrated in FIG. 6A are, in comparison with the configuration of the first embodiment shown in FIG. 5A, that the clocked inverters 16, 15 of the second circuit 5 are replaced by the transfer gates 21, 22 made from P-channel and N-channel FETS, and an XOR circuit is formed from the first circuit 4 and the second circuit 5, while the third circuit 6 is formed from an AND circuit. As shown in FIG. 6B, this provides the same function as the configuration shown in FIG. 5A. Even in this type of configuration, it is possible to obtain the same effect as the first embodiment shown in FIG. 5A. Furthermore, the total number of elements making up the logic circuit 3 is reduced while the layout area in the CMOS process is not necessarily reduced to any significant extent.

In addition, there is a possibility that the set-up time of the output from the DUT to the flip-flop is slightly increased, therefore, adequate advanced study is necessary when this configuration is adopted.

Also, it is simple to make changes such as a change in the polarity of the signals, and a change in the positioning of the gate input signal for a clocked inverter (the first control signal A and Din or the second control signal B and Din).

This invention is not limited to the embodiments described above, it is also possible to combine part of the logic circuit 3 of the present invention with a flip-flop. For example, the third circuit 6 may be combined with the ith F/F circuit 1, and the clocked inverters 16, 15 or transfer gates 21, 22 of the second circuit 5 may be combined with the (i+1) th F/F circuit 2.

As clearly shown in the foregoing explanation, by means of the present invention, the XOR value of the first input signal and the second input signal is output in accordance with the first control signal, or, the second input signal is output irrespective of the first input signal, so that an ideal logic circuit is provided, connected to the P/P circuit in the LFSR.

In addition, in a testable circuit made up of an LFSR using the above-mentioned logic circuit, it is possible to carry out a signature compression, a normal operation, a scanning operation, and a reset operation without the insertion of an AND circuit in the data path from the DUT to the input of the F/F circuit.

What is claimed is:

1. A logic circuit comprising:

a first circuit with two output terminals, wherein a second input signal and a first control signal are received, and, in the case where the first control signal has one logical value, the second input signal and the inverse value of the second input signal are output from each of the output terminals, and in the case where the first control signal has another logical value, the second input signal is output from both of the two output terminals; and a second circuit, wherein a first input signal and the output signal from the first circuit are received, and, in the case where the first control signal has the one logical value, an exclusive NOR value of the first input signal and the second input signal is output by selecting the second input signal or its inverse value that is output from the first circuit in accordance with the logical value of the first input signal, then inverting and outputting the selected second input signal, and in the case where the first control signal has the other logical value, the second input signal that is output from both of the two output terminals of the first circuit is inverted and output from the second circuit regardless of the logical value of the first input signal.

2. A logic circuit comprising:

a logic circuit as claimed in claim 1; and a third circuit with one output, wherein a third input signal and a second control signal are received, and, in the case where the second control signal has a first logical value, the inverted value of the third input signal is output to the first circuit as the second input signal, and in the case where the second control signal has the other logical value, a fixed value is output to the first circuit as the second input signal.

3. A logic circuit as claimed in claim 1 wherein:

the first circuit comprises:

a first inverter for inverting the first control signal and outputting the inverted first control signal;

a first clocked inverter for receiving the second input signal, inverting and outputting that signal or disabling that signal in accordance with the first control signal and the output signal from the first inverter; and a first transfer gate for disconnecting I/O terminals of the first clocked inverter when the first clocked inverter is ON, and connecting the I/O terminals of the first clocked inverter, when the first clocked inverter is OFF, in accordance with the first control signal and the output signal from the first inverter; and the second circuit comprises:

a second inverter for inverting the first input signal and outputting the inverted first input signal;

a second clocked inverter having an input terminal connected to an output terminal of the first clocked inverter for ON/OFF control according to the first input signal and the output signal of the second inverter; and a third clocked inverter having an input terminal connected to an input terminal of the first clocked inverter and an output terminal connected to the output terminal of the second clocked inverter for ON/OFF control inversely to the ON/OFF control of the second clocked inverter, according to the first input signal and the output signal of the second inverter.

4. A logic circuit as claimed in claim 3 wherein:

the first circuit comprises:

a first inverter for inverting the first control signal and outputting the inverted first control signal;

a first clocked inverter for receiving the second input signal, inverting and outputting that signal or disabling that signal in accordance with the first control signal and the output signal from the first inverter; and a first transfer gate for disconnecting I/O terminals of the first clocked inverter when the first clocked inverter is ON, and connecting the I/O terminals of the first clocked inverter when the first clocked inverter is OFF, in accordance with the first control signal and the output signal from the first inverter; and the second circuit comprises:

a second inverter for inverting the first input signal and outputting the inverted first input signal;

a second clocked inverter having an input terminal connected to an output terminal of the first clocked inverter for ON/OFF control according to the first input signal and the output signal of the second inverter; and a third clocked inverter having an input terminal connected to an input terminal of the first clocked inverter and an output terminal connected to the output terminal of the second clocked inverter for ON/OFF control inversely to the ON/OFF control of the second clocked inverter, according to the first input signal and the output signal of the second inverter.

5. A testable circuit comprising:

a logic circuit as claimed in claim 2;

n flip-flop (F/F) circuits connected in cascade from first to nth, a preceding one and a subsequent one of said F/F circuits being connected in cascade via the logic circuit so that the third input signal of the logic circuit becomes the output of the preceding F/F circuit and the output signal of the second circuit of the logic circuit becomes the input for the subsequent F/F circuit;

a feedback circuit comprising an exclusive OR circuit which performs an exclusive OR on the output of specified F/F circuits including the nth F/F circuit; and a selection circuit connected to the first F/F circuit through a logic circuit which selects an output signal from a scan chain or an output signal from the feedback circuit and makes the selected signal the third input signal, based on the first control signal.

6. A testable circuit as claimed in claim 5 wherein, in accordance with the first control signal and the second control signal, an output signal from a device under test is input in parallel as the first input signal and signature-compressed in the case where the first and second control signals have one logical value; the output signal from the device under test is stored in a respective corresponding F/F circuit as the first input signal in the case where the first control signal has one logical value and the second control signal has another logical value; a value stored in the respective F/F circuit is scanned and consecutively read out in the case where the first control signal has the other logical value and the second control signal has the one logical value; and a fixed value is stored in the respective F/F circuit in the case where the first and second control signals have the other logical value.

7. A logic circuit comprising:

a first circuit with two output terminals, wherein a second input signal and a first control signal are received, and, in the case where the first control signal has one logical value, the second input signal and the inverse value of the second input signal are output from each of the two output terminals, and in the case where the first control signal has another logical value, the second input signal is output from both of the two output terminals;

a second circuit, wherein a first input signal and the two output signals from the first circuit are received, and, in the case where the first control signal has one logical value, an exclusive OR value of the first input signal and the second input signal is output by selecting and outputting a second input signal or, its inverse value which is output from the first circuit in accordance with the logical value of the first input signal, and in the case where the first control signal has another logical value, the second input signal which is output from both of the output terminals of the first circuit is also output from the second circuit regardless of the logical value of the first input signal; and a third circuit with one output, wherein a third input signal and a second control signal are received, and, in the case where the second control signal has one logical value, the third input signal is output to the first circuit as the second input signal, and in the case where the second control signal has the other logical value, a fixed value is output to the first circuit as the second input signal.

8. The logic circuit as claimed in claim 7, wherein the first circuit comprises:

a first inverter for inverting the first control signal and outputting the inverted first control signal;

a first clocked inverter for receiving the second input signal, inverting and outputting that signal, or disabling that signal by turning itself OFF in accordance with the first control signal and an output signal from the first inverter; and a first transfer gate for disconnecting I/O terminals of the first clocked inverter when the first clocked inverter is ON, and connecting the I/O terminals of the first clocked inverter in the first circuit when the first clocked inverter is OFF, in accordance with the first control signal and the output signal from the first inverter; and the second circuit comprises:

a second inverter for inverting the first input signal and outputting the inverted first input signal;

a second transfer gate for controlling the connecting and disconnecting of an output terminal of the first clocked inverter to an output terminal of the second circuit in accordance with the first input signal and the output signal from the second inverter; and a third transfer gate controlling the disconnecting and connecting of an input terminal of the first clocked inverter to an output terminal of the second circuit inversely to the connecting and disconnecting of the second transfer gate, in accordance with the first input signal and the output signal from the second inverter.

9. A testable circuit comprising:

the logic circuit as claimed in claim 7;

n flip-flop (F/F) circuits connected in cascade from first to nth, a preceding one and a subsequent one of said F/F circuits being connected in cascade via the logic circuit so that the third input signal of the logic circuit becomes the output of preceding F/F circuit and the output signal of the second circuit of the logic circuit becomes the input for the subsequent F/F circuit;

a feedback circuit comprising an exclusive OR circuit which performs an exclusive OR on outputs of specified F/F circuits including the nth F/F circuit; and a selection circuit connected to the first F/F circuit through a logic circuit which selects an output signal from a scan chain or an output signal from the feedback circuit and makes the selected signal the third input signal, based on the first control signal.

10. A testable circuit comprising:

the logic circuit as claimed in claim 7;

n flip-flop (F/F) circuits connected in cascade from first to nth, a preceding one and a subsequent one of said F/F circuits being connected in cascade via the logic circuit so that the third input signal of the logic circuit becomes the output of the preceding F/F circuit and the output signal of the second circuit of the logic circuit becomes the input for the subsequent F/F circuit;

a feedback circuit comprising an exclusive OR circuit which performs an exclusive OR on outputs of specified F/F circuits including the nth F/F circuit; and a selection circuit connected to the first F/F circuit through a logic circuit which selects an output signal from a scan chain or an output signal from the feedback circuit and makes the selected signal the third input signal, based on the first control signal, wherein, in accordance with the first control signal and the second control signal, an output signal from a device under test is input in parallel as the first input signal and signature-compressed in the case where the first and second control signals have one logical value; the output signal from the device under test is stored in a respective corresponding F/F circuit as the first input signal in the case where the first control signal has one logical value and the second control signal has another logical value; a value stored in the respective F/F circuit is scanned and consecutively read out in the case where the first control signal has the other logical value and the second control signal has the one logical value; and a fixed value is stored in the respective F/F circuit in the case where the first and second control signals have the other logical value.

\* \* \* \* \*